United States Patent [19]

Marine et al.

[11] 4,295,148

[45] Oct. 13, 1981

[54] METHOD OF FABRICATION OF ELECTROLUMINESCENT AND PHOTODETECTING DIODES

[75] Inventors: Jean Marine; Michel Ravetto, both of Grenoble, France

[73] Assignee: Commissariat a l'Energie Atomique, Paris, France

[21] Appl. No.: 22,607

[22] Filed: Mar. 21, 1979

[30] Foreign Application Priority Data

Mar. 23, 1978 [FR] France ............................ 78 08522

[51] Int. Cl.³ .................... H01L 33/00; H01L 31/00; H01L 31/18
[52] U.S. Cl. ....................................... 357/17; 29/572; 29/576 B; 148/1.5; 357/30
[58] Field of Search ............... 29/572, 576 B; 148/1.5, 148/177; 357/30, 17, 19, 91; 136/264, 265; 250/211 J

[56] References Cited

U.S. PATENT DOCUMENTS 3,366,819  1/1968  Crowder et al. .................... 313/108
3,732,471  5/1973  Hou et al. ............................. 357/61

Primary Examiner—Aaron Weisstuch
Attorney, Agent, or Firm—Thomas R. Boland

[57] ABSTRACT

A layer of thickness $x_j$ is formed at the surface of a wafer of p-type ZnTe semiconductor material and compensated so as to provide insulation with high resistivity. Ions are implanted with sufficient energy to form a trapping region of thickness $x_1$ at the surface of the semiconductor and to form beneath the trapping region an insulating region of thickness $x_3$, with $x_1 < x_j$. The diode has high efficiency both for emission of light having well-defined wavelengths and for current generation when subjected to light radiation.

13 Claims, 4 Drawing Figures

METHOD OF FABRICATION OF ELECTROLUMINESCENT AND PHOTODETECTING DIODES

This invention relates to a method of fabrication of diodes having properties of both emission and detection of light, and to diodes of this type.

It should at once be explained in more precise terms that, depending on the method of biasing adopted, the diodes in accordance with the invention are capable of emitting light having well-defined wavelengths or of generating a current when said diodes are subjected to light ratiation.

Even more specifically, the invention relates to diodes which exhibit these two types of properties and are fabricated from the semiconductor material ZnTe.

Electroluminescent diodes formed by ion implantation into a ZnTe semiconductor substrate are already known. The operation of diodes of this type has been described by Pfister and Marine in Acta Electronica, 1976, page 166.

However, the diodes obtained by methods of the prior art have low efficiencies both for emission and reception of the light beam. These diodes have a surface trapping zone and an insulating zone, the resistivity of which is of the order of $10^4$ to $10^6$ $\Omega$cm.

The present invention is precisely directed to a method of fabrication of diodes which are both electroluminescent and photodetecting but have substantially higher efficiencies for these two effects. These diodes are also fabricated by ion implantation into a substrate of ZnTe and have an insulating layer between the surface trapping zone and the substrate. However, these different portions of the semiconductor component are optimized so as to achieve a substantial improvement in the operation of the device.

In more exact terms, the method in accordance with the invention consists in the following steps:

(a) there is employed at the outset a wafer of p-type ZnTe semiconductor material;

(b) a layer of thickness $x_j$ is formed at the surface of said wafer and compensated in such a manner as to provide insulation with high resistivity;

(c) ions are implanted with sufficient energy to form a trapping zone of thickness $x_1$ at the surface of the semiconductor and to form beneath said zone an insulating zone of thickness $x_3$, with $x_1 < x_j$;

(d) a second metallic contact is formed on the second face of the wafer.

Preferably, a conductive deposit is formed at the surface of said compensated layer prior to implantation in order to serve as a second electrical contact and implantation is carried out through said conductive deposit.

Preferably also, there is initially employed a wafer of p-type overdoped ZnTe.

In a preferred mode of execution of the method, the compensated insulating surface layer and the upper conductive deposit are obtained by depositing a conductive layer on the top face of the wafer. This is carried out by heating and thus inducing the diffusion of atoms of the material constituting said layer within the wafer to a depth $x_j$, said material being such that its diffusion within the ZnTe produces a compensation of the ZnTe to said depth $x_j$. The ZnTe material in this region thus becomes insulating with a very high resistivity.

In accordance with this preferred mode of execution, the material which serves to form the conductive layer is selected from the group of materials which produce compensation of ZnTe after diffusion such as, for example, aluminum, indium, gold, magnesium, indium oxide, stannic oxide. Another preferable feature lies in the fact that said material is of aluminum or of indium oxide.

It is also preferable to ensure that the depth $x_j$ of the compensated layer is substantially equal to the depth of the insulating zone formed by ion implantation or in other words that, substantially, $x_j = x_1 + x_2$. In the event that the conductive material employed is opaque (as is the case with aluminum, for example), it will clearly be necessary to etch said material so as to form a transparent grid.

The invention is also concerned with electro-luminescent and/or photodetecting diodes having characteristics such as those obtained as a result of application of the method defined in the foregoing. In more exact terms, these diodes have a surface trapping zone, an insulating zone having a resistivity of the order of $10^7$ to $10^9$ $\Omega$cm and a deep p-type substrate of ZnTe.

Preferably, the deep substrate has a carrier density of the order of $10^{17}$ to $10^{18}$ at/cm$^3$.

A better understanding of the invention will in any case be obtained from the following description of one embodiment of the method according to the invention which is given by way of example without any limitation being implied, reference being made to the following drawings, wherein.

Figure 1:
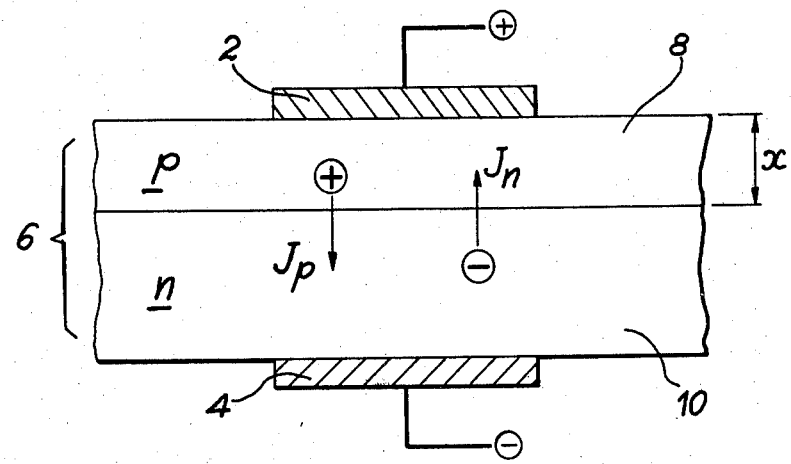
FIGS. 1 and 2 are diagrams showing the arrangement of a conventional diode, respectively for light emission and for light detection.

FIG. 1 shows diagrammatically a light-emitting diode (such as a GaAs diode, for example). This diode comprises a first electrode 2 connected to the positive terminal of a voltage source, a second electrode 4 connected to the negative terminal of said voltage source and a semiconductor substrate 6 having a p-type surface region disignated by the reference numeral 8 and an n-type lower region designated by the reference numeral 10. When the diode is forward-biased as shown in FIG. 1, the current is constituted by a flow of electrons ($J_n$) from the region 10 and by a flow of holes ($J_p$) from the p-region 8. Now in view of the fact that the mobility of electrons is much greater than that of the holes, the total current J is essentially constituted by the flow of electrons $J_n$. In consequence, the electrons injected into the p-type semiconductor (region 8) recombine so as to produce luminescence. In order to ensure efficient luminescence, the electrons must recombine radiatively at a distance from the surface. In other words, the thickness of the layer 8 (as designated by x) must be greater than the electron diffusion length. For example, in the case of the GaAs semiconductor, this diffusion length is of the order of 4 microns. As a general rule, manufacturers of electroluminescent diodes of GaAs take the necessary steps to ensure that x exceeds 5 microns.

Figure 2:
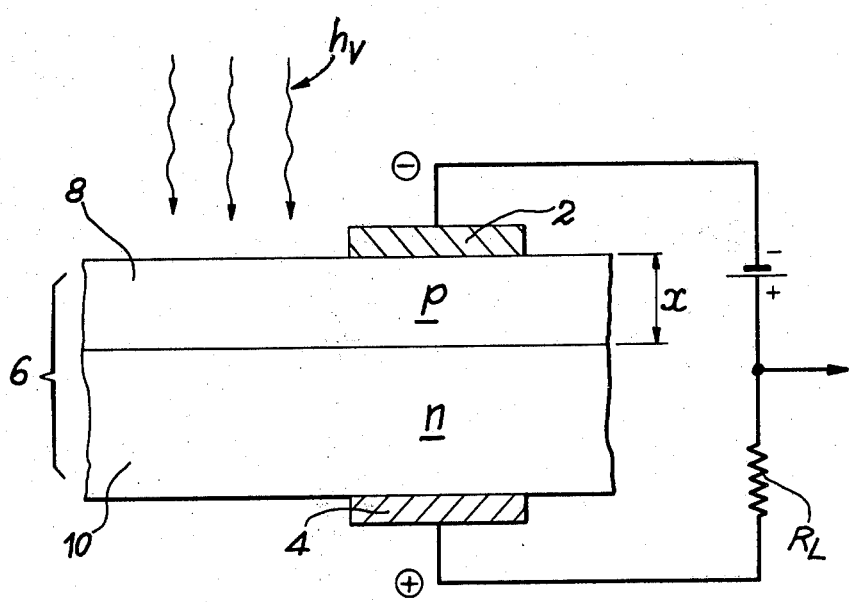
Figure 3A:
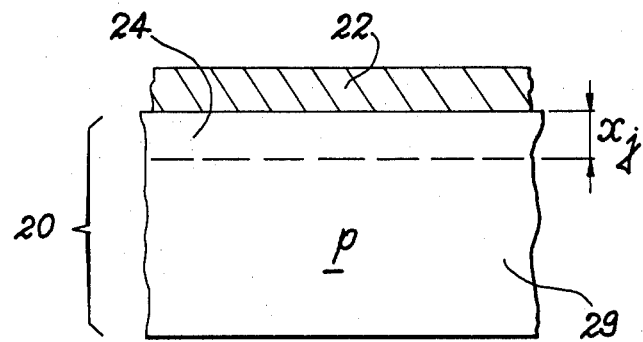
FIGS. 3a and 3b are diagrams illustrating the different steps of the preferred embodiment of the method according to the invention.
Figure 3B:
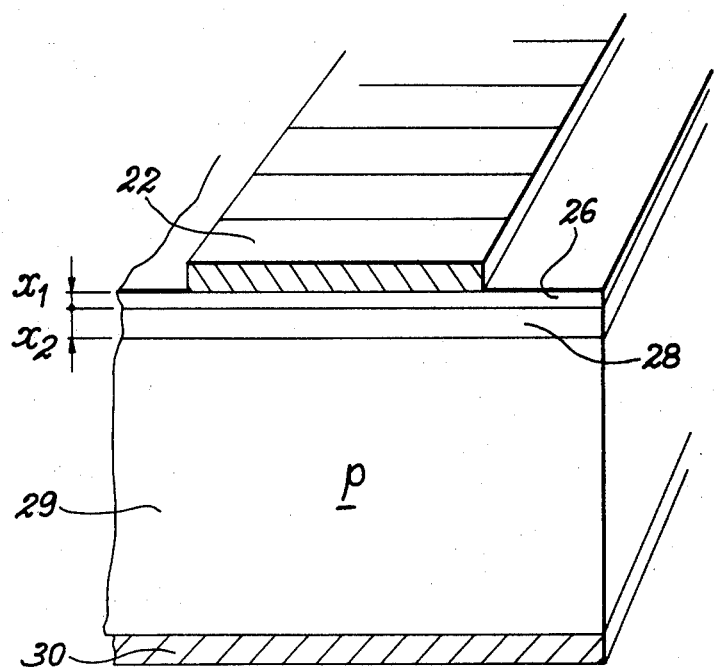

FIG. 2 shows the same diode which operates as a radiation detector. Biasing of the electrodes 2 and 4 is reversed. The p-type layer 8 and the n-type layer 10 are again present. When the energy of the light received by the diode is greater than the forbidden band of the semiconductor, the light intensity decreases from the surface in accordance with an exponential law. In the case of a GaAs semiconductor, the light is absorbed to a depth of the order of $10^{-4}$ to $10^{-5}$ cm, that is to say to a depth corresponding to a fraction of a micron. The electron-hole pairs produced by the light absorbed by the semiconductor are therefore very superficial. If the layer 8 is of substantial thickness, the charge carriers cannot readily reach the junction in order to be "sorted" by the internal electric field or induced by the electrode bias or be collected in the external circuit of the diode in order to ensure the detection function. It is understood that, in order to carry out effective collection of a current, the thickness x of the layer 8 would necessarily have to be of small value in order to enable the charge carriers to reach the junction of the diode.

In the case of a diode of conventional type comprising a surface layer and an n-type substrate, it can thus be understood that there is an incompatibility between operation as an emitting diode and operation as a receiving diode, that is to say for detection of radiation.

Moreover, this brief outline of the operation of an emitting diode and of a receiving diode is intended to provide a clearer understanding of the characteristics and advantages of the diode in accordance with the invention.

As mentioned in the foregoing, the method in accordance with the invention makes it possible to obtain electroluminescent and photodetecting diodes provided with an insulating region and having very high quantum efficiency in comparison with electroluminescent diodes fabricated up to the present time while at the same time providing good performance as detecting diodes.

In the preferred mode of execution of the method, the starting element consists of a wafer 20 ZnTe having p-type conductivity. In accordance with known practice, said wafer is preferably overdoped p-type. More specifically, ZnTe in the as-drawn state has a carrier concentration of the order of $2 \times 10^{15}$ at/cm$^3$. The term "overdoped" is intended to mean that the starting material has a carrier concentration of the order of $10^{17}$ to $10^{18}$ at/cm$^3$. This overdoping can be obtained by means which are well known to those versed in the art. There is deposited on the top face of the wafer 20 a metallic layer 22 which is of aluminum in the example herein described and which will serve as a top electrical contact. Said layer is etched so as to delimit the elementary diodes.

As mentioned earlier, the first step of the method consists in forming a compensated or in other words insulating region at the surface of the wafer 20 to a depth $x_j$. To this end, the wafer is heated together with the aluminum layer so as to induce diffusion of the aluminum into the ZnTe to a depth $x_j$. The insulating surface layer 24 having a depth $x_j$ is then obtained whilst the remainder of the wafer remains of the p-type.

This compensation results from a process which is characteristic in particular of the ZnTe semiconductor, the resistivity of which increases by several decades when doped with aluminum by reason of the association of inherent defects with the impurity which has been introduced.

Aluminum is employed in the example herein described but it should be noted that aluminum could be replaced by indium, magnesium or even by gold in some instances. It has also been observed that a compensated region is formed by means of indium oxide which could be replaced by stannic oxide if necessary.

The main function of the diffusion process is to form the compensated region 24. However, this diffusion process has a second effect, namely that of improving the quality of contact between the ZnTe wafer and the metallic layer 22.

The second step of the method consists in subjecting the wafer 20 to ion implantation through the metallic layer 22. This implantation is preferably carried out with boron. Ion implantation into ZnTe has the effect of forming a surface region 26 for trapping holes and an insulating region 28. The reference $x_1$ will designate the thickness of the trapping region and the reference $x_2$ will designate the thickness of the insulating region produced solely by implantation. The second metallic contact 30 is then formed on the p-type substrate. It should be noted that this contact can be formed directly after diffusion of the aluminum.

Two adjustment factors come into effect at the time of implantation, namely the implantation dose and the implantation energy.

The dose of implanted ions is so adjusted that the quantity of capture centers which are present within the thickness $x_1$ of the trapping region is sufficient. Taking into account experimental values, the number of trapping centers must be higher than $5 \times 10^{12}$ cm$^{-2}$. The dose to be implanted depends on the nature of the impurity. In the case of boron, the optimum dose appears to be in the vicinity of $3 \times 10^{13}$ at/cm$^2$.

In regard to the implantation energy E, this latter serves to adjust the depth of the trapping region $x_1$. It should be observed that, in addition, since implantation is performed through the top metallic contact 22, a large proportion of the defects resulting from implantation remains located within the metallic layer (reference can be made in this connection to French Pat. No. EN 74 27558 of Aug. 8, 1974).

Two cases can be distinguished, depending on the value E of the implantation energy. When this energy is very high, a large number of defects are created in the semiconductor material and the trapping region $x_1$ is of substantial depth. In consequence, the control voltage must also be of high value. In the case of low implantation energy, there are but few defects in the semiconductor crystal. The depth of the trapping region is small but contains very few active trapping centers.

For these two reasons, the inventors have shown that the optimum value is obtained when the implantation energy is such that the position of the peak value $R_p$ of the gaussian distribution curve of implanted ions is located at the metal-semiconductor interface. It should be explained that, in the case of a given energy, the value of $R_p$ depends on the one hand on the nature of the implanted ions and on the other hand on the nature of the metal through which the ion implantation is performed. For example, in the case of implantation of boron through 2000 Å of aluminum, the optimum implantation energy is 57 keV.

As has been mentioned earlier, the other very important parameter of the method is the diffusion depth which gives the depth of compensation $x_j$. As has already been indicated, the function of this diffusion is to increase the resistivity of the insulating region in order to give this latter a very high value. It should be observed in connection with this diffusion depth that, if $x_j$ is of low value ($x_j$ of considerably lower value than $x_1+x_2$), the barrier to extraction of holes is low and the injection efficiency of the device is reduced. If $x_j$ is of high value ($x_j$ being considerably higher than $x_1+x_2$), the efficiency of the device is improved in emission. It should be noted on the other hand that, in the first place, luminescence will come from the diffused region and therefore will have a different color from the luminescence emitted by the starting substrate and, in the second place, the control voltage of the device will rise very rapidly. The optimum value appears to be attained when the compensation front resulting from ion implantation reaches at least the front resulting from diffusion and preferably when $x_j = x_1 + x_2$.

It should be added that the resistivity resulting from diffusion of aluminium is of the order of $10^7$ to $10^9$ $\Omega$cm. In comparison, the resistivity of the insulating region formed solely by ion implantation is of the order of $10^4$ to $10^6$ $\Omega$cm.

It should be observed that, when overdoping of the starting ZnTe material is employed, ion implantation alone would not produce an insulating region of sufficient thickness and would result in a diode which emits a very small quantity of light (very low injection efficiency). In this case it appears necessary to carry out initial compensation in order to permit effective fabrication of an electroluminescent diode.

The operation of the diode in accordance with the invention in emission is as follows:

When forward bias is applied, light emission takes place in accordance with the following mechanism:

As long as the voltage at the terminals of the device is below a predetermined threshold value (of the order of 5 to 6 V), the current which flows through the junction is of very small value since it is limited by the space charge region which exists within the insulating region. This current is essentially composed of holes which flow from the p-type substrate towards the top metallic contact 22. During the motion of said holes, they are trapped in the trapping region 24. In consequence, the space charge density $\rho$ within the trapping region becomes more and more positive as the bias is increased. Since the electric field in this region is directly related to the value of $\rho$ by the equation:

$$E = \rho/\epsilon dx$$

(where $\epsilon$ is the dielectric constant of the semiconductor),
there comes a moment when, in the case of a trapped charge $\rho_c$, the electric field at the interface between metal 22 and trapping region 26 attains a critical value $E_c$ beyond which the electrons can be injected by tunnel effect from the top contact to the center of the crystal 29. These electrons are entrained by the electric field which prevails in the insulating region 28 and will undergo radiative recombination within the substrate 29. The light thus produced emerges from the front face of the crystal and passes through the top contact 22 which will previously have been etched in the form of a transparent grid in order to permit the passage of the light which is emitted or which is to be detected. It is also possible to employ a contact 22 formed of transparent material such as indium oxide or stannic oxide, for example.

When the diode is not biased or is reverse-biased, an electric field is located near the surface in the trapping region 26 and the insulating region 28. As it falls on the front face, the light is absorbed to a very small depth (of the order of 0.1 micron) as has already been explained earlier. The electron-hole pairs are therefore produced directly with the region in which an intense electric field is maintained. In consequence, said pairs are immediately subjected to the effect of the electric field and separated. Thus a photoelectric current flows within the external circuit of the diode. A system of this type has very high detection efficiency since the electrons and the holes have a low probability of recombination by virtue of the presence of the electric field within the thickness in which they are created.

It should be pointed out that, by virtue of the preliminary compensation of part of the semiconductor material by diffusion of the top metallic layer (in this mode of execution of the method), an insulating region 28 of very high resistivity is accordingly obtained. This high resistivity has the effect of improving the performances of the device to a very appreciable extent. It can thus be stated that, as the resistivity of this insulating region is higher, so the hole current is lower, and so the injection efficiency in emission is correspondingly higher. In fact, the electrons injected from the contact to the substrate produce luminescence whereas the holes do not take part in the luminescence. Moreover, the electric field will be effective for collecting the carriers produced by the incident light at the time of operation of the diode in detection.

In the mode of execution described earlier, the compensated region is obtained by diffusion of the metallic contact in ZnTe. However, this compensated region could be obtained differently. For example, it would be possible to start from a wafer of ZnTe and to form the compensated zone directly on the top surface of the wafer by epitaxial growth in order to obtain the insulating region having a thickness $x_j$. The top metallic deposit would be formed in a subsequent stage. It should be noted, however, that a slight diffusion of the metallic deposit would be very desirable in this case for improving the quality of the metal-semiconductor contact. Starting from this structure, the ion implantation would be carried out as described in the foregoing.

Diodes of this type which are both electro-luminescent and photodetecting have many potential applications by virtue of the fact that, in addition, a large number of diodes of this type can be formed on a single substrate. A few examples of such applications are given hereunder:

The construction of a screen for visual display and data reading. This screen is constituted by a matrix of discrete and individually addressable diodes and is capable of displaying a set of data in much the same manner as a cathode-ray screen while at the same time performing the function of an image pickup tube if the screen is operated in the detection mode. In these two operating modes, it is necessary to incorporate an electronic decoding circuit.

The construction of a system for writing and reading documents. By projecting the image of each diode on photosensitive paper, it is possible to reconstitute a coded electronic signal on a utilizable medium (the paper). Similarly, by projecting the image of a document to be read on each diode, it would be possible to obtain an electrical signal which is proportional to the quantity of light received by each point (video signal). From this point of view, the diodes in accordance with the invention can serve as a reading and writing element in remote data-transmission systems (remote copying, remote data processing and so forth).

What we claim is:

1. A method of fabricating electroluminescent and photodetecting diodes, comprising
    (a) providing a wafer of p-type ZnTe semi-conductor material;

(b) forming a compensated layer of thickness $x_j$ in a first surface of said wafer in such a manner as to provide insulation with high resistivity;

(c) implanting ions in the first surface with sufficient energy to form a trapping region of thickness $x_1$ and to form beneath said trapping region an insulating region of thickness $x_2$, with $x_1 < x_j$; and (d) forming a metallic contact layer on a second surface of the wafer.

2. A method according to claim 1, wherein a conductive deposit which is intended to serve as an electrical contact is formed on the surface of said compensated layer prior to step (b) thereof, and wherein said ion implantation is thereafter carried out through said conductive deposit.

3. A method according to claim 2, wherein the said step (b) is carried out by forming a metallic deposit on the surface of said wafer, heating said wafer in such a manner as to obtain a diffusion of atoms of the material constituting said metallic deposit to a depth $x_j$, said deposit being such that the diffused atoms produce an insulating compensated region of thickness $x_j$ within the ZnTe material.

4. A method according to claim 3, wherein the material constituting the metallic deposit is selected from the group comprising aluminum, indium, magnesium, gold, indium oxide and stannic oxide.

5. A method according to claim 3, wherein the material is aluminum or indium oxide.

6. A method according to any one of claims 1 to 5, wherein the thickness $x_j$ is equal at a maximum to the sum of thickness $x_1$ and $x_2$.

7. A method according to claim 6, wherein the thickness $x_j$ is substantially equal to the sum of thicknesses $x_1$ and $x_2$.

8. A method according to any of claims 3 to 5, wherein the energy of implantation of ions through the metallic deposit is such that the peak value of the gaussian curve of distribution of implanted ions coincides substantially with the interface between said metallic deposit and compensated region.

9. A method according to any one of claims 1 to 5, wherein the wafer of ZnTe starting material is overdoped.

10. A method according to claim 9, wherein the ZnTe starting material contains a carrier density of $10^{17}$ to $10^{18}$ at/cm$^3$.

11. An electroluminescent and/or photodetecting diode fabricated by means of the method defined according to any one of claims 1 to 5.

12. An electroluminescent and/or photodetecting diode of ZnTe comprising a substrate of p-type ZnTe, a trapping region at a surface of the substrate, a resistive region below said trapping region having a resistivity of the order of $10^7$ to $10^9$ cm, and an electrical surface contact.

13. A diode according to claim 12, wherein said substrate of ZnTe has a carrier density of the order of $10^{17}$ to $10^{18}$ at/cm$^3$.

* * * * *